United States Patent
Levardo et al.

(10) Patent No.: US 6,753,613 B2
(45) Date of Patent: Jun. 22, 2004

(54) STACKED DICE STANDOFFS

(75) Inventors: Melvin N. Levardo, Cavite (PH); Marcelo S. Gonzales, Cavite (PH)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/100,192

(22) Filed: Mar. 13, 2002

(65) Prior Publication Data

US 2003/0173679 A1 Sep. 18, 2003

(51) Int. Cl.[7] .................. H01L 23/48; H01L 23/52; H01L 29/40

(52) U.S. Cl. ....................... 257/780; 257/777

(58) Field of Search ................. 257/780, 781, 257/783, 778, 777

(56) References Cited

U.S. PATENT DOCUMENTS

| | | | | |
|---|---|---|---|---|
| 5,818,107 | A | * | 10/1998 | Pierson et al. |
| 5,872,400 | A | * | 2/1999 | Chapman et al. |
| 6,169,328 | B1 | * | 1/2001 | Mitchell et al. |
| 6,175,157 | B1 | * | 1/2001 | Morifuji |
| 6,184,062 | B1 | * | 2/2001 | Brofman et al. |
| 6,184,582 | B1 | * | 2/2001 | Coult et al. |
| 6,238,949 | B1 | * | 5/2001 | Nguyen et al. |
| 6,271,598 | B1 | * | 8/2001 | Vindasius et al. |
| 6,313,998 | B1 | * | 11/2001 | Kledzik et al. |
| 6,392,304 | B1 | * | 5/2002 | Butler |
| 6,472,758 | B1 | * | 10/2002 | Glenn et al. |

* cited by examiner

Primary Examiner—S. V. Clark
(74) Attorney, Agent, or Firm—Rob G. Winkle

(57) ABSTRACT

A microelectronic package including a first microelectronic die and a second microelectronic die with a plurality of standoffs extending therebetween and an encapsulation material disposed between the first microelectronic die and the second microelectronic die, which extends between at least two the plurality of standoffs.

23 Claims, 9 Drawing Sheets

STACKED DICE STANDOFFS

BACKGROUND OF THE INVENTION

1. Field of the Invention

The present invention relates to stacked dice packages and methods for fabricating the same. In particular, the present invention relates to standoffs of pillars positioned to separate microelectronic dice during fabrication of stacked dice packages.

2. State of the Art

Higher performance, reduced cost, increased miniaturization of integrated circuit components, and greater packaging densities of microelectronic devices are ongoing goals of the computer industry. One method of increasing the density of microelectronic device packages is to stack the individual microelectronic dice within the packages.

FIG. 19 illustrates an exemplary assembly 200 comprising a first microelectronic die 202 (such as a microprocessor, a chipset, a memory device, an ASIC, and the like) attached by a back surface 204 thereof to a substrate 212 (such as an interposer, a motherboard, a back surface of another microelectronic die, or the like) by a first layer of adhesive 214. A plurality of bond pads 216 is disposed on an active surface 206 of the first microelectronic die 202. The first microelectronic die bond pads 216 are generally placed near edges of the first microelectronic die active surface 206 and are electrically connected by a first plurality of bond wires 218 to corresponding first plurality of lands 222 on a surface 224 of the substrate 212.

A second microelectronic die 232 is attached by a back surface 234 thereof to the first microelectronic die active surface 206. A plurality of bond pads 242 is disposed on an active surface 236 of the second microelectronic die 232. The second microelectronic die bond pads 242 are generally placed near edges of the second microelectronic die active surface 236 and are electrically connected by a second plurality of bond wires 244 to a second plurality of lands 246 on the substrate surface 224. The first plurality of substrate lands 222 and the second plurality of substrates lands 246 are generally connected to conductive traces (not shown) that are in contact with external electrical connection devices, such as solder ball or pins (not shown), which connect the assembly 200 to external electrical devices (not shown).

When the second microelectronic die 232 is about the same size or larger than the first microelectronic die 202, such that the first plurality of wire bonds 218 may be contacted by the second microelectronic die 232, a standoff is necessary to raise the second microelectronic die 232 above the first microelectronic die 202 to give clearance for the first plurality of wire bonds 218. As shown in FIG. 17, a thick layer of die attach adhesive 252 (such as epoxies, urethane, polyurethane, silicone elastomers, and the like) may be disposed between the first microelectronic die active surface 206 and the second microelectronic die back surface 234. Thereafter, an encapsulation material 254 is disposed to cover the first microelectronic die 202 and the second microelectronic die 232.

One problem that must be addressed in the connection of various different types of materials (i.e., microelectronic dices, adhesives, encapsulation materials, etc.) is the coefficient of thermal expansion ("CTE") for each material. The CTE is a measurement of the expansion and contraction of each material during heating and cooling cycles, respectively. These heating and cooling cycles occur during the operation of the microelectronic device 202 and during power up and power down of the microelectronic device 202.

The use of a thick die attach adhesive layer 252 can cause stresses due to a mismatch between the CTE of the thick die attach adhesive layer 252 and the microelectronic dice (first microelectronic die 202 and second microelectronic die 232) as the assembly 200 heats to a normal operating temperature when on and room temperature when off. Furthermore, materials used for the thick die attach adhesive layer 252 generally shrink during the curing process, which also places stresses on the first microelectronic die 202 and the second microelectronic die 232. Stresses due to CTE mismatch and curing increase the probability that cracks will initiate and propagate in both the first microelectronic die 202 and the second microelectronic die 232. These cracks may cause the failure of the first microelectronic die 202 and/or the second microelectronic die 232.

Another problem with thick die attach adhesive layers 252 is their tendency to absorb moisture, which can have adverse affects on the first microelectronic die 202 and the second microelectronic die 232. A further problem is proper flow control of the adhesive material. Improperly applied adhesive can interfere with the first plurality of bond wires 218 and first plurality of bond pads 216.

As shown in FIG. 20, to overcome for the problems with the use of thick die attach adhesive layers 252 (see FIG. 19), a spacer 266 (such as silicon, having about the same CTE as the first microelectronic die 202 and the second microelectronic die 232) may be attached to the first microelectronic die active surface 206 with a first, thin die spacer adhesive layer 262 and attached to the second microelectronic die back surface 234 with a second, thin die spacer adhesive layer 264 to form a package 270. However, using the spacer 262 involves additional processing steps and presents alignment problems, which increases the cost of the package 270.

Furthermore, with both packages described above, the CTE can cause delamination between the adhesive layers and the microelectronic dice.

Therefore, it would be advantageous to develop a stacked package providing adequate spacing between the stacked microelectronic dice that does not have the disadvantages of thick adhesive layers or of spacers.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENTS

Figure 1:
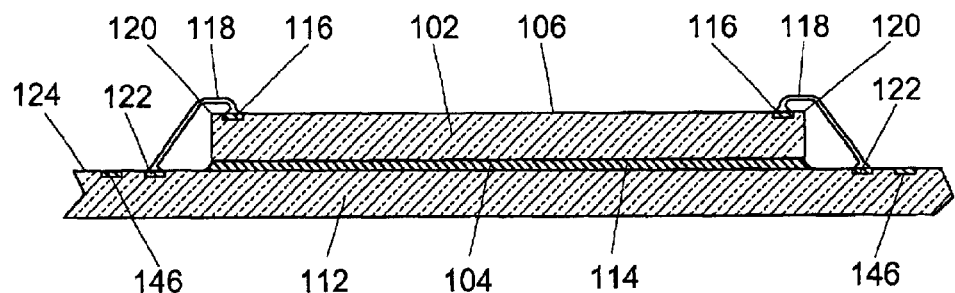
FIGS. 1 and 2 are side cross-sectional and top plan views, respectively, of a first microelectronic die attached by a back surface to a substrate and a first plurality of wire bonds extending between an active surface of the first microelectronic die and the substrate, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Figure 2:
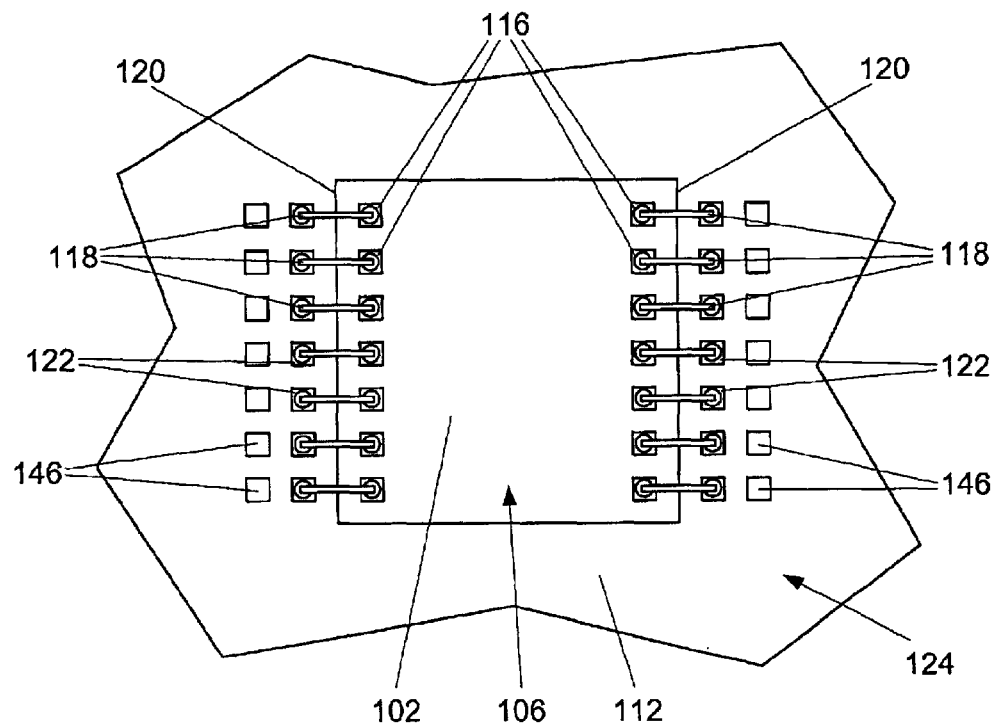

FIGS. 1–7 illustrate a method of fabricating a microelectronic device assembly according to the present invention. FIG. 1 illustrates a first microelectronic die 102 (such as a microprocessor, a chipset, a memory device, an ASIC, and the like) attached by a back surface 104 thereof to a substrate 112 (such as an interposer, a motherboard, a back surface of another microelectronic dice, or the like) by a first layer of adhesive 114. As shown in FIGS. 1 and 2, a plurality of bond pads 116 is disposed on an active surface 106 of the first microelectronic die 102. The first microelectronic die bond pads 116 are generally placed near edges 120 of the first microelectronic die active surface 106. The first microelectronic die 102 is electrically connected to the substrate 112 by attaching a first plurality of bond wires 118 between the first microelectronic die bond pads 116 and a corresponding first plurality of lands 122 on a surface 124 of the substrate 112.

Figure 3:
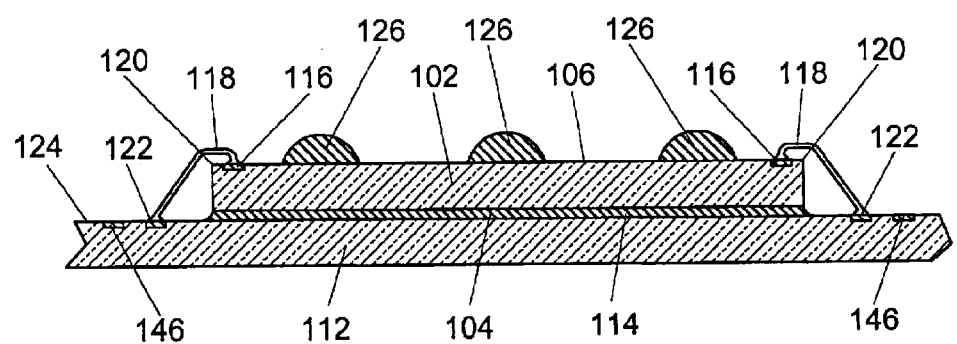
FIGS. 3 and 4 are side cross-sectional and top plan views, respectively, of the assembly of FIGS. 1 and 2 wherein a plurality of globules of adhesive material are disposed on the active surface of the first microelectronic die active surface, according to the present invention.
Figure 4:
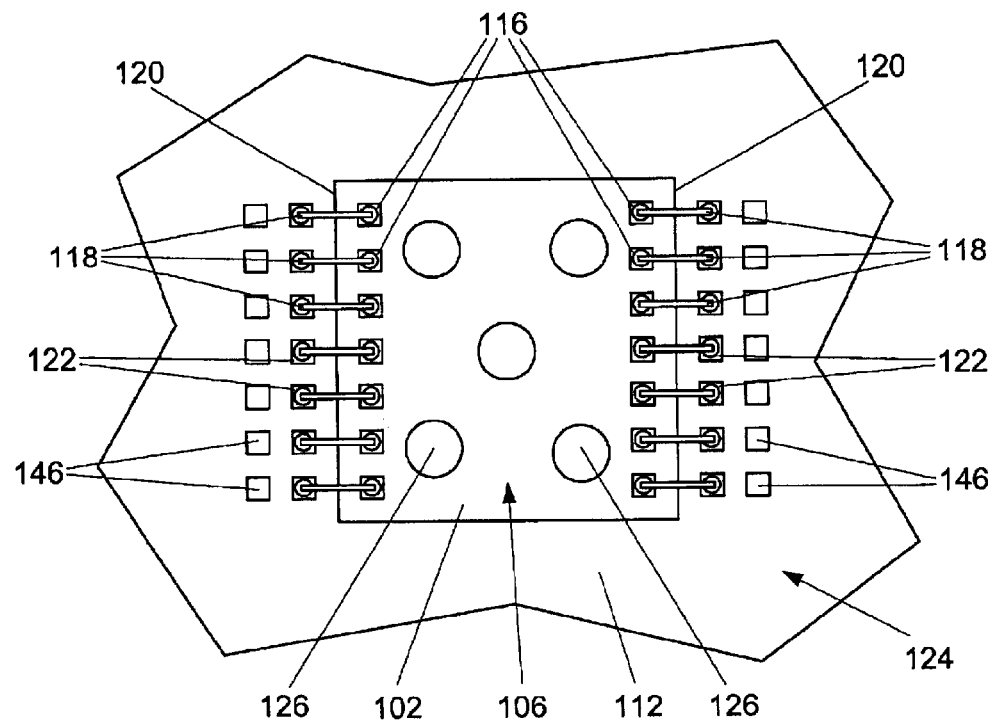
Figure 5:
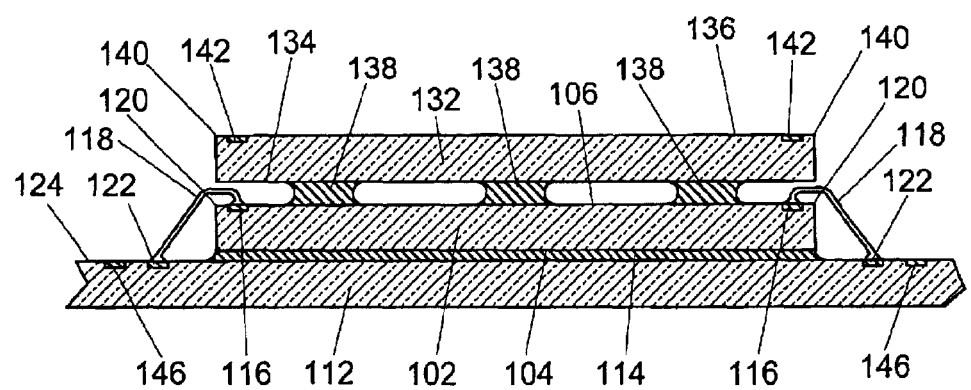
FIGS. 5 and 6 are side cross-sectional and top plan views, respectively, of a second microelectronic die attached by a back surface to the first microelectronic die active surface, according to the present invention.

As shown in FIGS. 3 and 4, a plurality of adhesive globules 126 is disposed, such as by dispensing with a needle, on the first microelectronic die active surface 106 in position where they will not interfere with the first plurality of wire bonds or the first microelectronic die bond pads 116. The adhesive globules may be epoxies, urethane, polyurethane, silicone elastomers, and the like. Preferably, the adhesive globules comprise an adhesive paste having a viscosity of between about 10,000 and 20,000 cps at 5 rpm with thixotropy of between about 5 and 10. Adhesives having such properties may include various Dexter Hysol Epoxy adhesives, available from Locite Americas, Windsor Locks, Conn., USA, and various silicone based adhesives, such as Dow Corning 7920, available from Dow Corning, Midland, Mich., USA. Although FIG. 5 illustrates five adhesive globules 126, it is understood that the present invention is not so limited. Any number of globules may be used, which may be dependent on the type and viscosity of the adhesive material used.

A second microelectronic die 132 is attached to the first microelectronic die 102 by contacting a back surface 134 of the second microelectronic die 132 with the adhesive globules 126, which form adhesive pillars or standoffs 138, as shown in FIG. 5. The viscosity of the material used for the adhesive standoffs 138 holds the second microelectronic die 132 away from the first plurality of bond wires 118 (even after subsequent curing of adhesive standoffs 138).

Figure 6:
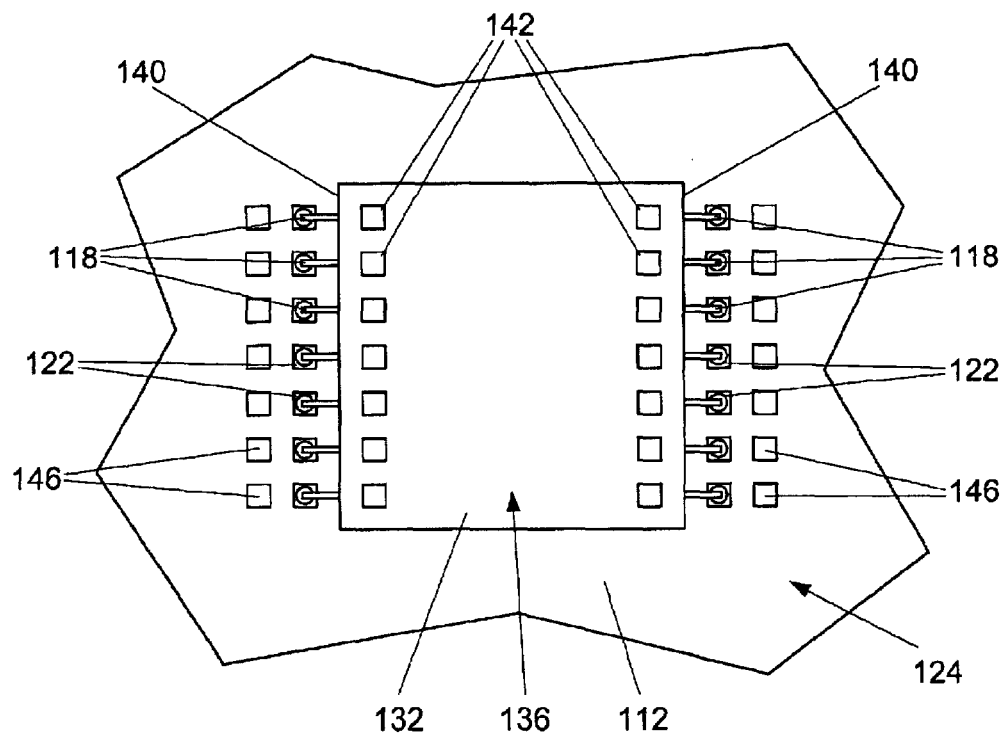
Figure 7:
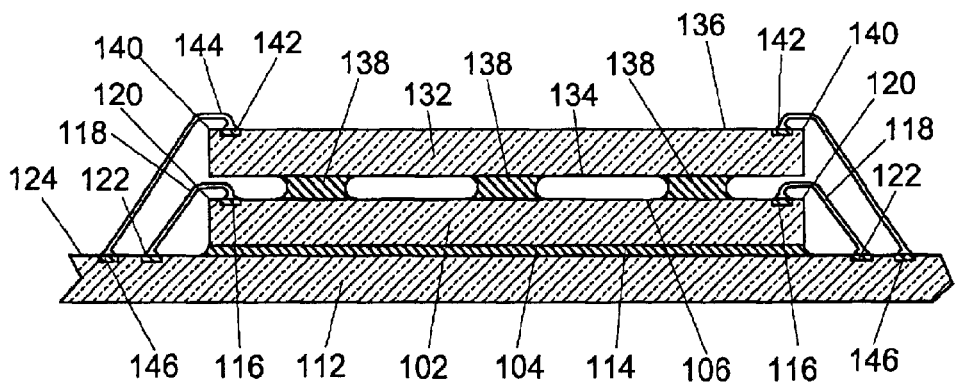
FIG. 7 is a side cross-sectional view of the assembly of FIGS. 5 and 6 having a second plurality of wire bonds extending between an active surface of the second microelectronic die and the substrate, according to the present invention.

As shown in FIGS. 5 and 6, the second microelectronic die 132 includes a plurality of bond pads 142 disposed on an active surface 136 thereof, which are generally placed near edges 140 of the second microelectronic die active surface 136. After curing the adhesive standoffs 138, the second microelectronic die 132 is electrically connected to the substrate 112 by attaching a second plurality of bond wires 144 between the second microelectronic die bond pads 142 and a corresponding second plurality of lands 146 on the substrate surface 124, as shown in FIG. 7. The curing of the adhesive standoffs 138 has a lower CTE affect on the microelectronic dice than a single layer of adhesive material, because the contact area of the CTE mismatched materials is smaller. The first plurality of substrate lands 122 and the second plurality of substrates lands 146 are generally connected to conductive traces (not shown) that are in contact with external electrical connection devices, such as solder ball or pins (not shown), which may connect to external electrical devices (not shown).

Figure 8:
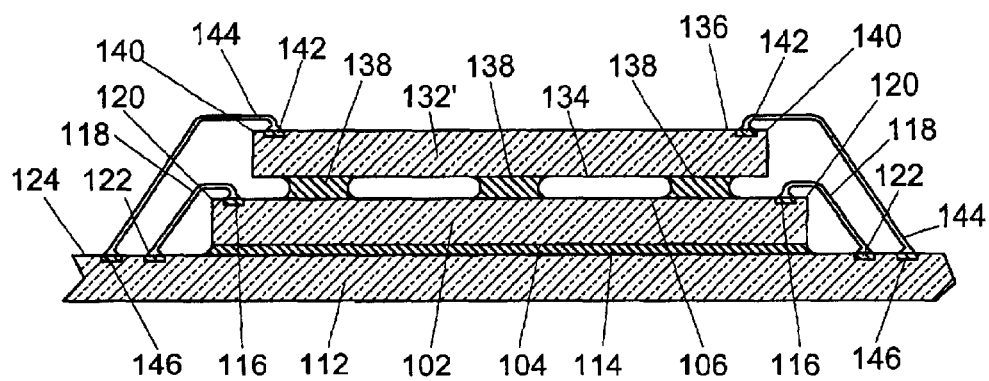
FIGS. 8–10 are side cross-sectional views of other embodiments of stacked microelectronic die assemblies, according to the present invention.
Figure 9:
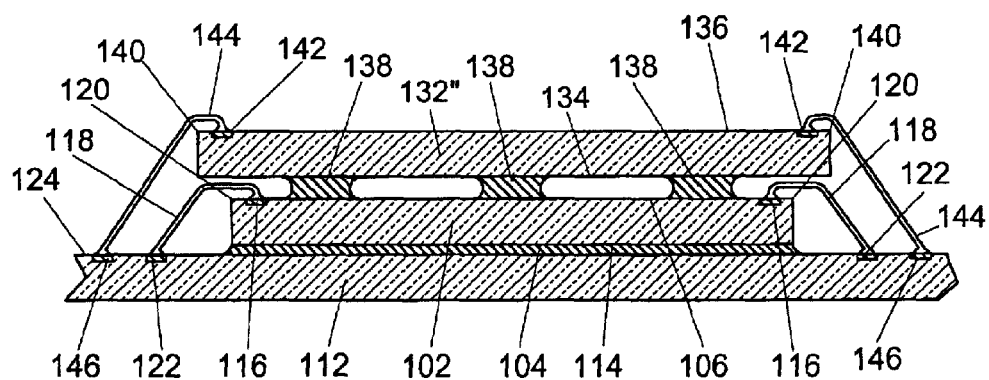

Although FIGS. 1–7 show an embodiment wherein the first microelectronic die 102 is approximately the same size as the second microelectronic die 132, the present invention is not so limited. For illustration purposes, FIG. 8 shows an embodiment wherein a second microelectronic die 132' is smaller in at least one dimension from said first microelectronic die 102 and FIG. 9 shows an embodiment wherein a second microelectronic die 132" is larger in at least one dimension from said first microelectronic die 102.

Figure 10:
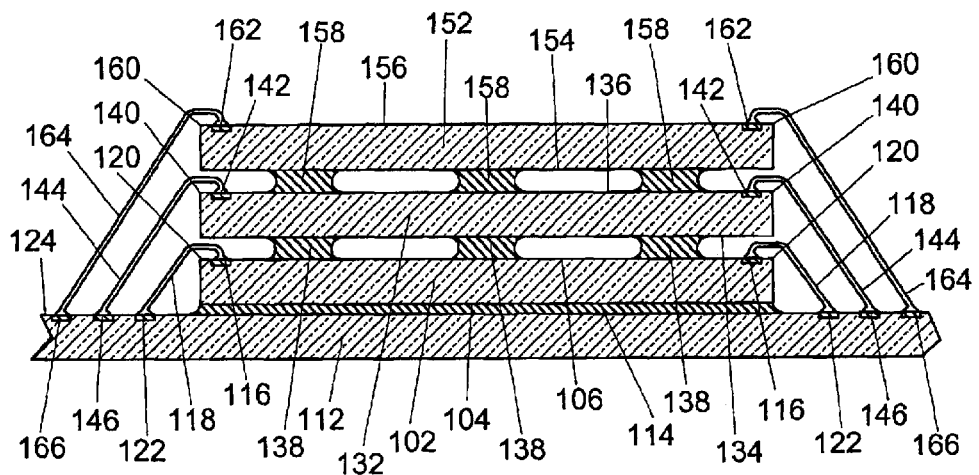

Furthermore, although FIGS. 1–7 shown an embodiment having two microelectronic dice (the first microelectronic die 102 and the second microelectronic die 132), the present invention is not so limited, as any number of microelectronic dice may be stacked using the present invention. For illustration purposes, FIG. 10 shows an embodiment having three microelectronic dice wherein a third microelectronic die 152 is stacked on the second microelectronic die 132. The process of stacking the third microelectronic die 152 is the same as stacking the second microelectronic die 132, as discussed above. A second plurality of adhesive globules is disposed on the second microelectronic die active surface 136 in positions where they will not interfere with the second plurality of wire bonds 144 or the second microelectronic die bond pads 142. The third microelectronic die 152 is attached to the second microelectronic die 132 by contacting a back surface 154 of the third microelectronic die 152 with the adhesive globules, which form adhesive standoffs 158, as shown in FIG. 10. The third microelectronic die 152 includes a plurality of bond pads 162 disposed on an active surface 166 thereof, which are generally placed near the edges 160 of the third microelectronic die active surface 156. After curing the adhesive standoffs 158, the third microelectronic die 152 is electrically connected to the substrate 112 by attaching a third plurality of bond wires 164 between the third microelectronic die bond pads 162 and a corresponding third plurality of lands 166 on the substrate surface 124.

Figure 11:
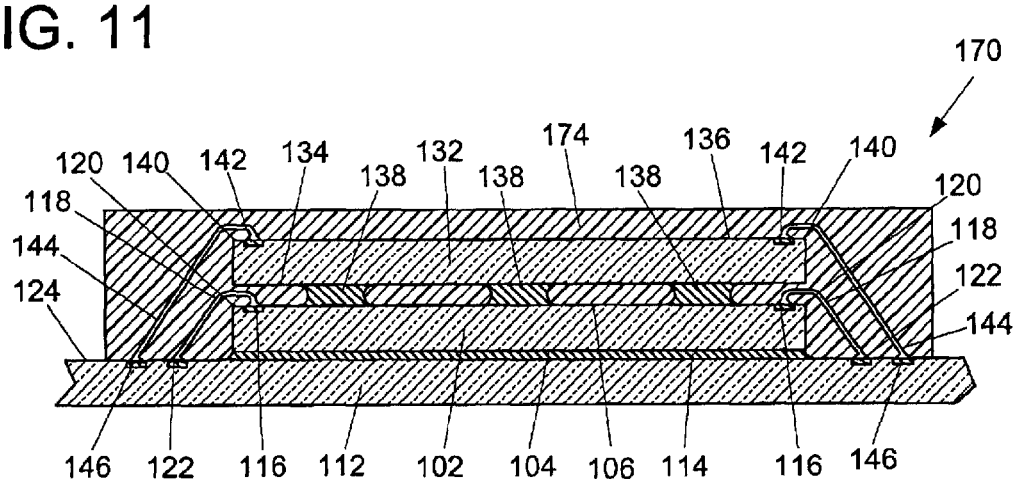
FIG. 11 is a side cross-sectional view of the assembly of FIG. 5 having an encapsulation material disposed thereon, according to the present invention.

After the stacking of the microelectronic dice, an encapsulation material 174 (such as a filled epoxy material, a silicon elastomer, or the like) is disposed to cover the first microelectronic die 102 and the second microelectronic die 132 to form a microelectronic package 170, as shown in FIG. 11. For illustration purposes, the stacked assembly shown in FIG. 7 is encapsulated in FIG. 11. As shown in FIG. 11 and as will be understood by those skilled in the art, the encapsulation material 174 flows between the first microelectronic die 102 and the second microelectronic die 132, and between at least two of the adhesive standoffs 138. The encapsulation material 174 between the first microelectronic die 102 and the second microelectronic die 132 greatly reduces or eliminates the affect of the CTE mismatch between the adhesive standoffs 138 and the first microelectronic die 102 and the second microelectronic die 132, because hardness of the encapsulation material 174 after curing reduces or eliminates the movement of the microelectronic dice. Furthermore, the reduced volume of adhesive material in the adhesive standoffs 138, compared to a single thick adhesive layer, reduces or eliminates problem induced by moisture absorption.

Figure 12:
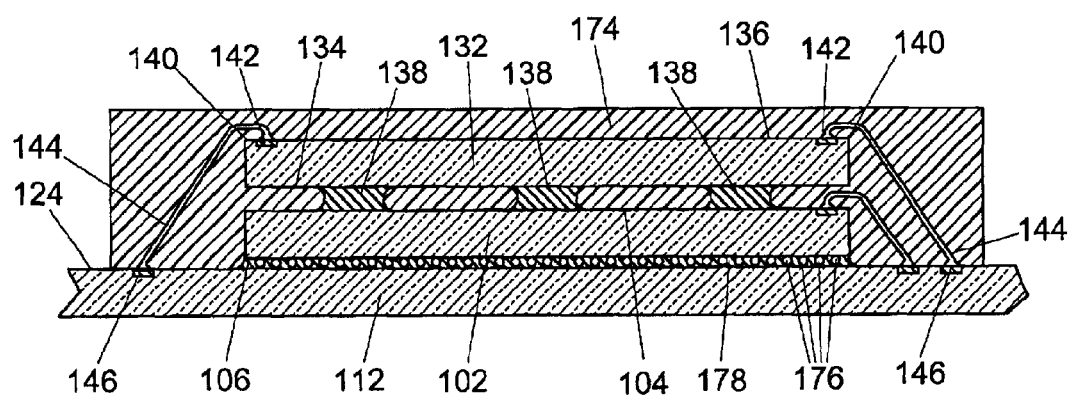
FIG. 12 is a side cross-sectional view of an alternate assembly having an encapsulation material disposed thereon, according to the present invention.

It is, of course, understood that the first microelectronic die 102 could also be a flip-chip, as known in the art, wherein the active surface 106 is electrically connected to the substrate 112 through a plurality of solder balls 176 with an underfill material 178 disposed between the first microelectronic die 102 and the substrate 112, as shown in FIG. 12. The standoffs 138 extend between the first microelectronic die back surface 104 and the second microelectronic die back surface 134.

Figure 13:
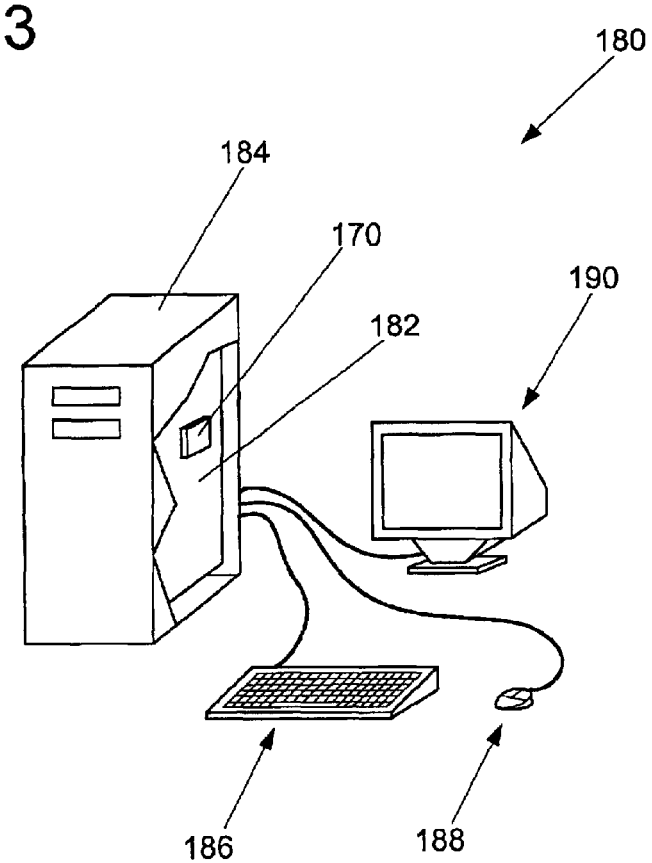
FIG. 13 is a schematic of a computer system, according to the present invention.

The microelectronic packages formed by the present invention, such as microelectronic package 170 of FIG. 11, may be used in a computer system 180, as shown in FIG. 13. The computer system 180 may comprise a motherboard 182 with the microelectronic package 170 attached thereto, within a chassis 184. The motherboard 182 may be attached to various peripheral devices including a keyboard 186, a mouse 188, and a monitor 190.

Figure 14:
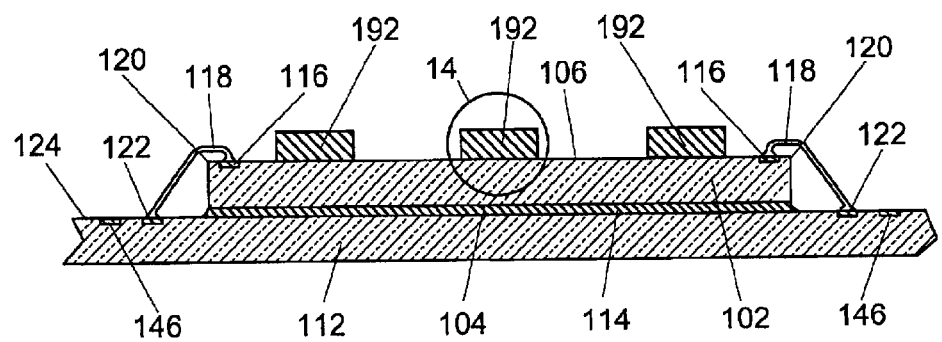
FIG. 14 is a side cross-sectional view of an embodiment of an assembly of FIG. 1 having solid standoffs disposed on the active surface of the first microelectronic die active surface, according to the present invention.
Figure 15:
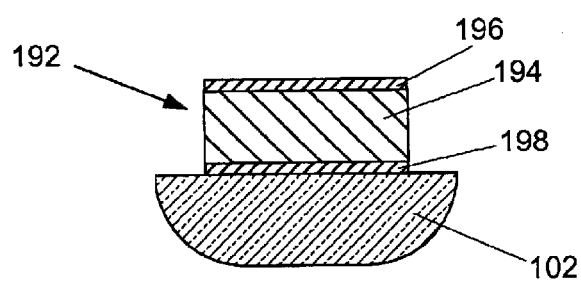
FIG. 15 is a close-up view of the inset 15 of FIG. 14, according to the present invention.
Figure 16:
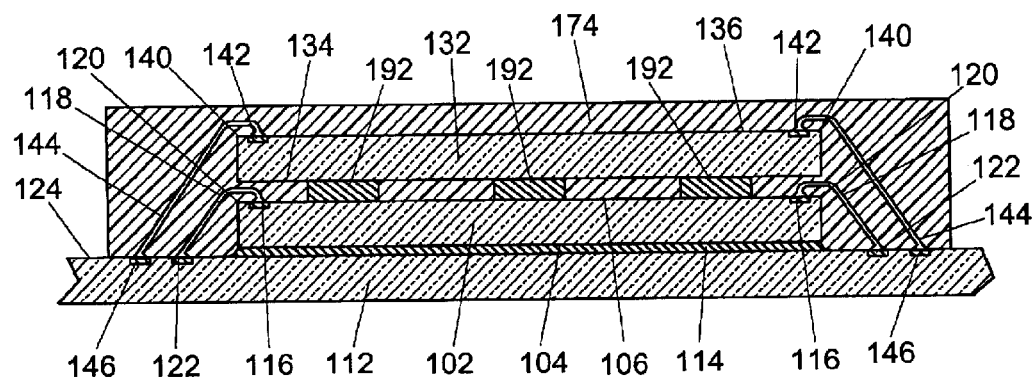
FIG. 16 is a side cross-sectional view of an encapsulated embodiment having solid standoffs therein, according to the present invention.

Of course, the current invention is not limited to the use of an adhesive material to form the pillars. As shown in FIG. 14, the standoffs 192 may comprise solid structures or plugs. As shown in FIG. 15, the standoffs 192 may include a core 194, such as a tape material, plastic, and the like (preferably an elastomeric material, such as Dexter Propriety Pliable Organics Spacer, available from Locite Americas, Windsor Locks, Conn., USA), having a first adhesive surface 196 to attach to the second microelectronic die back surface 134 and a second adhesive surface 198 to attach to the first microelectronic die active surface 106. As will be understood by those skilled in the art, the placement of the standoffs 192 occurs in place of the disposition of the adhesive globules 126, as shown in FIGS. 3 and 4, and the method of fabrication remains the same. FIG. 16 illustrates the assembly of FIG. 14 having the encapsulation material 174 disposed thereon. As will be understood by those skilled in the art, the encapsulation material 174 flows between the first microelectronic die 102 and the second microelectronic die 132, and between at least two of the standoffs 192.

Figure 17:
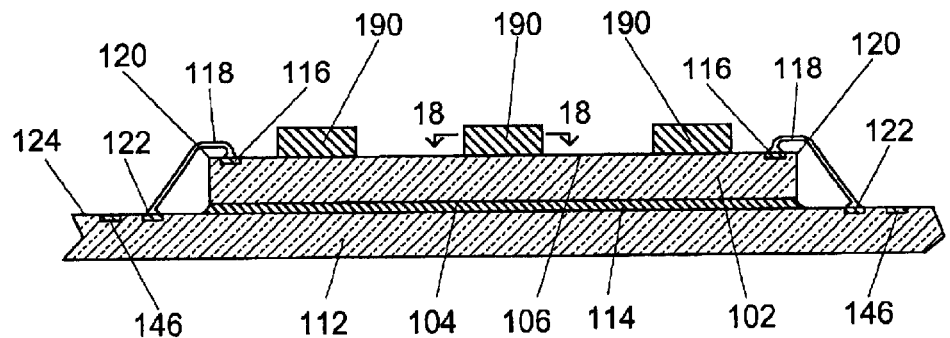
FIG. 17 is a side cross-sectional view of another embodiment, according to the present invention.
Figure 18A:
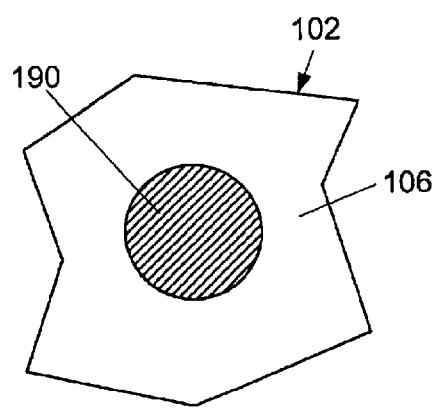
FIGS. 18a–d are various potential cross-sectional views of a standoff along lines 18—18 of FIG. 17, according to the present invention.
Figure 18B:
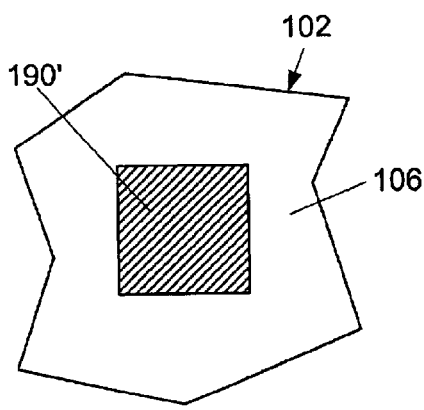
Figure 18C:
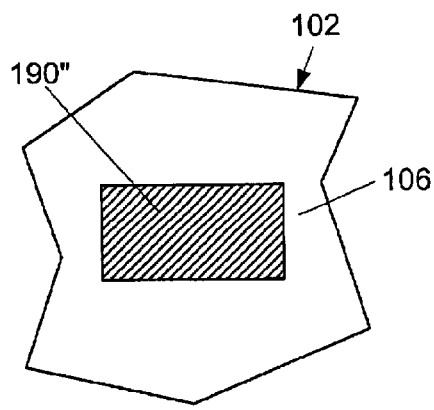
Figure 18D:
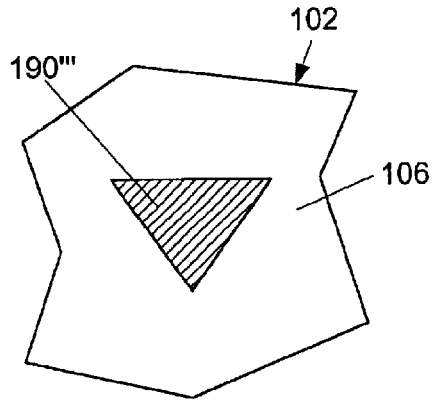
Figure 19:
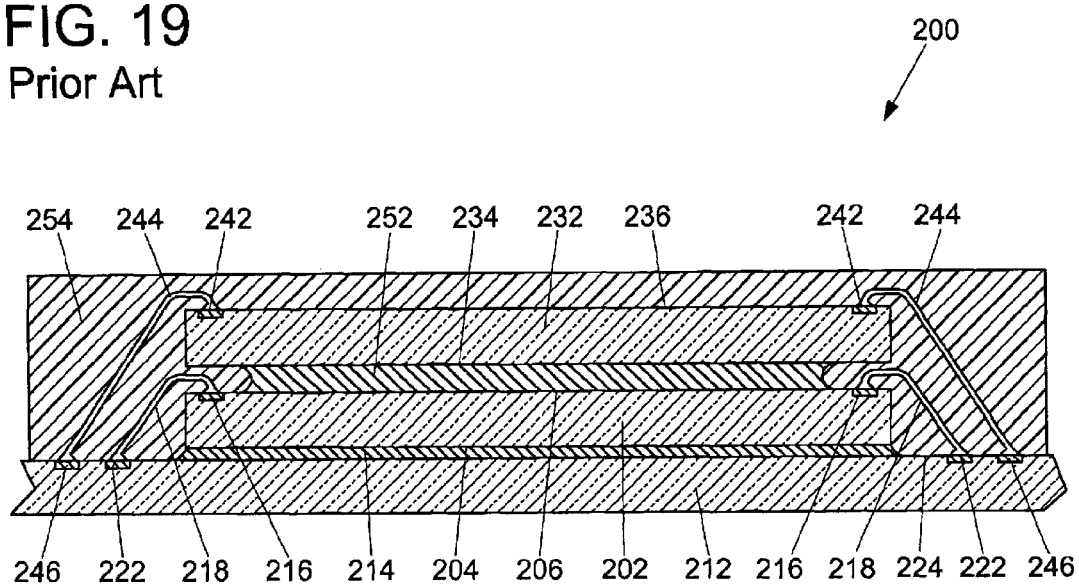
FIG. 19 is a side cross-sectional view of a stacked dice assembly, as known in the art.
Figure 20:
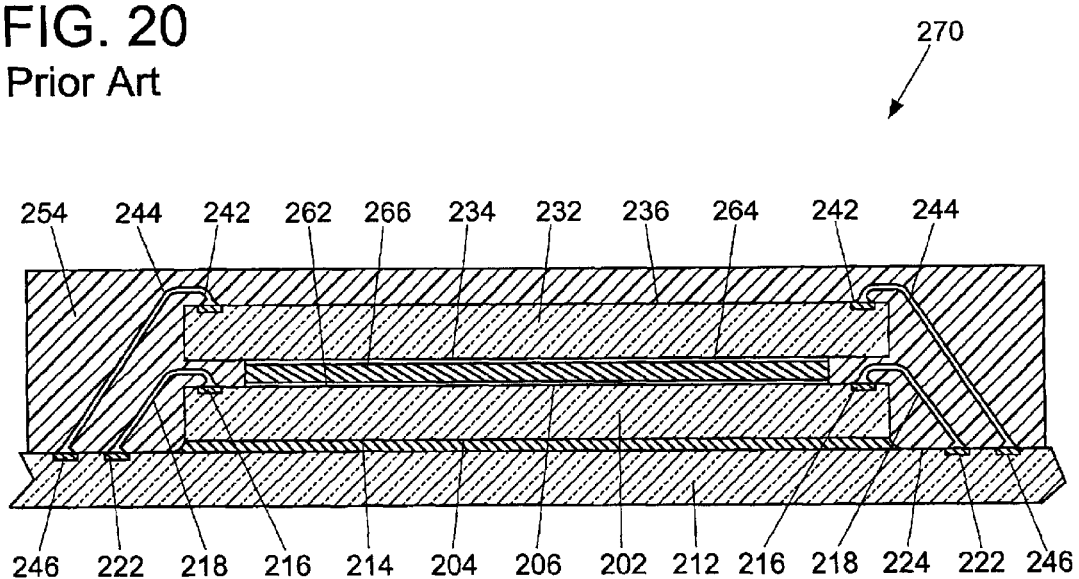
FIG. 20 is a side cross-sectional view of another stacked dice assembly, as known in the art.

It is further understood that for the embodiments illustrate in FIGS. 1–13, the adhesive used to from the standoffs need not necessary be globules. Rather the adhesive may be formed, such as by stenciling, from wet or dry adhesives to form the standoffs 190 shown in FIG. 17. Stencilable adhesive materials may include include various silicone based adhesives, such as Dow Corning 6910, 7910, and 7920, available from Dow Corning, Midland, Mich., USA. Furthermore, as shown in FIGS. 18a–d, the cross sectional shape or the standoffs 190 may be any appropriate shape including circular (element 190 in FIG. 18a), square (element 190' in FIG. 18b), rectangular (element 190" in FIG. 18c), and triangular (element 190'" in FIG. 18d). Such shapes can be achieved with stencil shapes for wet materials, or cut or punched out for dry materials. It is, of course, understood that such cross sectional shapes also apply to the embodiments discussed and illustrated with regard to FIGS. 14–16.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A microelectronic assembly, comprising:
   a first microelectronic die;
   a second microelectronic die;
   a plurality of standoffs extending between said first and said second microelectronic die, wherein said plurality of standoffs provides clearance for at least one bond wire extending from between said first microelectronic die and said second microelectronic die; and
   an encapsulation material disposed between said first microelectronic die and said second microelectronic die, and between at least two of said plurality of standoffs.

2. The microelectronic assembly of claim 1, wherein said plurality of standoffs extend between said an active surface of said first microelectronic die and a back surface of said second microelectronic die.

3. The microelectronic assembly of claim 1, wherein said plurality of standoffs comprise an adhesive material.

4. The microelectronic assembly of claim 3, wherein said adhesive material is selected for the group consisting of epoxies, urethane, polyurethane, and silicone elastomers.

5. The microelectronic assembly of claim 1, wherein said plurality of standoffs comprises solid structures.

6. The microelectronic assembly of claim 5, further including a least one adhesive layer disposed between at least one of said solid structures and at least one of said first microelectronic die and said second microelectronic die.

7. A microelectronic package, comprising:

a substrate;

a first microelectronic die attached to said substrate;

at least one additional microelectronic die;

a plurality of standoffs extending between said first and said at least one additional microelectronic die, wherein said plurality of standoffs provides clearance for at least one bond wire extending from between said first microelectronic die and said at least one additional microelectronic die; and an encapsulation material disposed between said first microelectronic die and said at least one additional microelectronic die, and between at least two of said plurality of standoffs.

8. The microelectronic package of claim 7, wherein said plurality of standoffs extend between said an active surface of said first microelectronic die and a back surface of said at least one additional microelectronic die.

9. The microelectronic package of claim 7, further including a plurality of bond wires extending from at least one bond pad on said first microelectronic die active surface to corresponding lands on said substrate.

10. The microelectronic package of claim 7, further including a plurality of bond wires extending from at least one bond pad on said at least one additional microelectronic die active surface to corresponding lands on said substrate.

11. The microelectronic package of claim 7, wherein said plurality of standoffs comprise an adhesive material.

12. The microelectronic package of claim 11, wherein said adhesive material is selected for the group consisting of epoxies, urethane, polyurethane, and silicone elastomers.

13. The microelectronic package of claim 7, wherein said plurality of standoffs comprises solid structures.

14. The microelectronic package of claim 13, further including a least one adhesive layer disposed between at least one of said solid structures and at least one of said first microelectronic die and said second microelectronic die.

15. A computer system including at least one microelectronic die assembly, comprising:

a first microelectronic die;

a second microelectronic die;

a plurality of standoffs extending between said first and said second microelectronic die, wherein said plurality of standoffs provides clearance for at least one bond wire extending from between said first microelectronic die and said second microelectronic die; and an encapsulation material disposed between said first microelectronic die and said second microelectronic die, and between at least two of said plurality of standoffs.

16. The computer system of claim 15, wherein said plurality of standoffs extend between said an active surface of said first microelectronic die and a back surface of said second microelectronic die.

17. The computer system of claim 15, wherein said plurality of standoffs comprise an adhesive material.

18. The computer system of claim 17, wherein said adhesive material is selected for the group consisting of epoxies, urethane, polyurethane, and silicone elastomers.

19. The computer system of claim 15, wherein said plurality of standoffs comprises solid structures.

20. The computer system of claim 19, further including a least one adhesive layer disposed between at least one of said solid structures and at least one of said first microelectronic die and said second microelectronic die.

21. The computer system of claim 15, further comprising a substrate.

22. The computer system of claim 21, wherein said plurality of standoffs extend between said an active surface of said first microelectronic die and a back surface of said second microelectronic die.

23. The computer system of claim 21, further including a plurality of bond wires extending from at least one bond pad on said first microelectronic die active surface to corresponding lands on said substrate.

* * * * *